United States Patent
Antonell et al.

(10) Patent No.: US 6,695,572 B2
(45) Date of Patent: Feb. 24, 2004

(54) METHOD AND APPARATUS FOR MINIMIZING SEMICONDUCTOR WAFER CONTAMINATION

(75) Inventors: Michael Antonell, Orlando, FL (US); Erik Cho Houge, Orlando, FL (US); Larry E. Plew, St. Cloud, FL (US); Catherine Vartuli, Orlando, FL (US); Jennifer Juszczak, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 61 days.

(21) Appl. No.: 09/966,156

(22) Filed: Sep. 28, 2001

(65) Prior Publication Data

US 2003/0063967 A1 Apr. 3, 2003

(51) Int. Cl.$^7$ .............................................. B65G 49/07
(52) U.S. Cl. ...................................................... 414/810
(58) Field of Search ................................ 414/217, 810, 414/939, 940, 937

(56) References Cited

U.S. PATENT DOCUMENTS

| | | | |
|---|---|---|---|
| 4,775,281 A | | 10/1988 | Prentakis |
| 4,778,332 A | * | 10/1988 | Byers et al. ................ 414/735 |
| 4,897,015 A | | 1/1990 | Abbe et al. |
| 4,973,563 A | | 11/1990 | Prigge et al. |
| 5,105,147 A | * | 4/1992 | Karasikov et al. .......... 324/537 |
| 5,452,795 A | | 9/1995 | Gallagher et al. |
| 5,711,647 A | | 1/1998 | Slocum |
| 5,950,843 A | | 9/1999 | Ohori |
| 5,974,680 A | | 11/1999 | Anderson et al. |
| 6,053,689 A | | 4/2000 | Li |
| 6,183,186 B1 | | 2/2001 | Howells et al. |
| 6,236,327 B1 | | 5/2001 | Yen et al. |
| 6,318,951 B1 | * | 11/2001 | Schmidt et al. .......... 414/744.5 |
| 6,340,405 B2 | * | 1/2002 | Park ...................... 156/345.32 |

OTHER PUBLICATIONS

S. Wolf and R.N. Tauber, *Silicon Processing for VLSI Era, vol. 1—Process Technology*, pp. 122–124, Second Edition (2000), Published by Lattice Press, Sunset Beach, California.

* cited by examiner

*Primary Examiner*—Eileen D. Lillis
*Assistant Examiner*—Charles A. Fox
(74) *Attorney, Agent, or Firm*—Robert L. Wolter, Esquire; Beusse Brownlee Wolter Mora & Maire, P.A.

(57) ABSTRACT

A method and apparatus for minimizing the surface contamination of semiconductor wafers (11) during the semiconductor device manufacturing process. Semiconductor wafers (11) are stored in a storage cassette (12) with their face sides (17) facing downward and their back sides (16) facing upward. Particulate contamination present on the back sides of the wafers is thereby secured to the wafers by the force of gravity, and the faces of the wafers are shielded from falling debris. An automated wafer handling device (19) is provided with a rotary joint (22) to accomplish the wafer flipping motion before inserting a wafer into a cassette and after removing the wafer from the cassette.

1 Claim, 5 Drawing Sheets

METHOD AND APPARATUS FOR MINIMIZING SEMICONDUCTOR WAFER CONTAMINATION

BACKGROUND OF THE INVENTION

This invention relates generally to semiconductor processing methods and apparatus and, more particularly, to a method and apparatus for handling of semiconductor wafers during processing.

One of the primary concerns in the manufacture of semiconductor devices, such as integrated circuit chips, is avoiding contamination from particulate matter which may fall onto or otherwise be deposited on a top surface or face of a semiconductor device. The manufacture of semiconductor devices includes multiple fabrication steps such as masking, etching, electroplating, chemical mechanical planarization and polishing, oxidation and dielectric layer deposition on a semiconductor wafer. Between these various process steps, the wafer may be picked up by a mechanical handling apparatus and moved to temporary storage. In some applications, a plurality of wafers may be collected and stored in a storage cassette between processing steps.

As shown in FIG. 1, a semiconductor wafer storage cassette includes a plurality of wafer support elements arranged to receive and support a plurality of stacked wafers. In one form, support elements engage wafers at their outer edges and support the wafers in horizontal, spaced planes. A robotic wand may be used to insert the wafers into and remove the wafers from the cassettes. To remove a wafer from a processing station, the wand engages the wafer using vacuum or other known means, then lifts and moves the wafer to the cassette where the wafer is stored until it is needed for a next processing step.

It is known that semiconductor-manufacturing areas must be maintained in an extremely clean condition in order to minimize the contamination of the wafers being processed. In spite of such efforts, particulate debris cannot be completely eliminated, and some semiconductor devices on some wafers must be scrapped as a result of particulate contamination. Accordingly, it is advantageous to provide apparatus and/or methods for reducing opportunities for contamination of semiconductor wafers during the manufacturing process.

SUMMARY OF THE INVENTION

Applicants have discovered that a possible source of contamination is debris that may accumulate on a backside of a semiconductor wafer during processing and which can then fall onto a face of another wafer when the wafers are stored in a stacked position between processing steps. The present invention addresses this potential source of contamination by changing how such semiconductor wafers are stored within storage cassettes between processing steps. In one form of the invention, wafers are stored in conventional cassettes but in an inverted position so that the wafer face is oriented downward. Accordingly, any debris falling under the force of gravity will land on a backside of the wafer where such debris will not affect the circuit formed on the face of the wafer. The invention further includes adapting the wafer handling apparatus, such as a vacuum wand, with a rotatable section to enable inversion of the wafer between processing equipment and storage. More particularly, the wand is adapted to rotate the wafer through 180 degrees in order to position the wafer in an upside down orientation in the storage cassette whereby, if contaminants do drop from a wafer in a cassette, the particles will fall on the backside of a lower stacked wafer. In one form, a rotary coupling enables the wand head of the handling device to rotate through 180 degrees, and/or rotate to a plurality of positions between a position of the wafer facing upward and upside down.

It is also contemplated that the wafers could be on one edge in a different form of cassette such that the wafers would only be rotated 90 degrees.

DETAILED DESCRIPTION OF THE INVENTION

Figure 1:
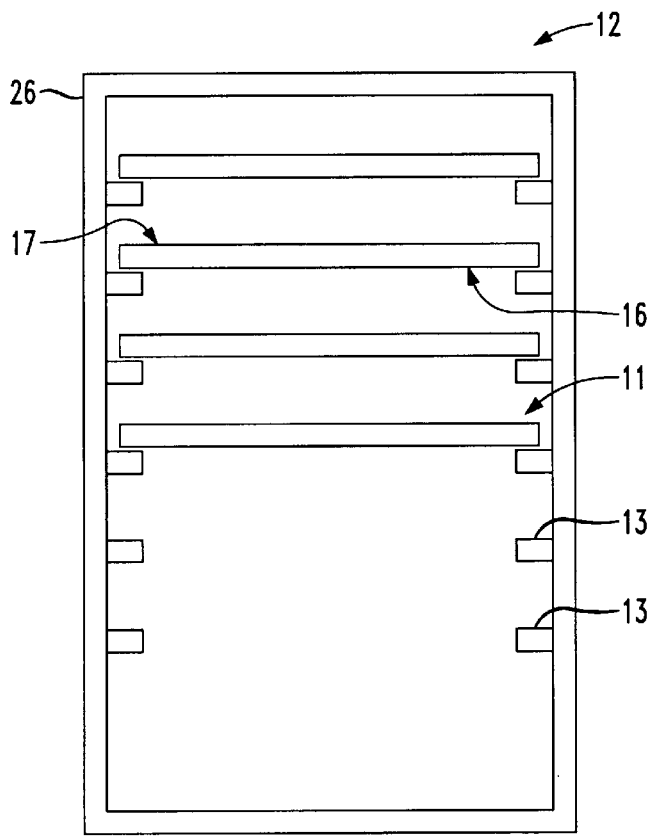
FIG. 1 is a front elevational view of a cassette with semiconductor wafers stored in a conventional face up position as is known in the prior art.
Figure 2:
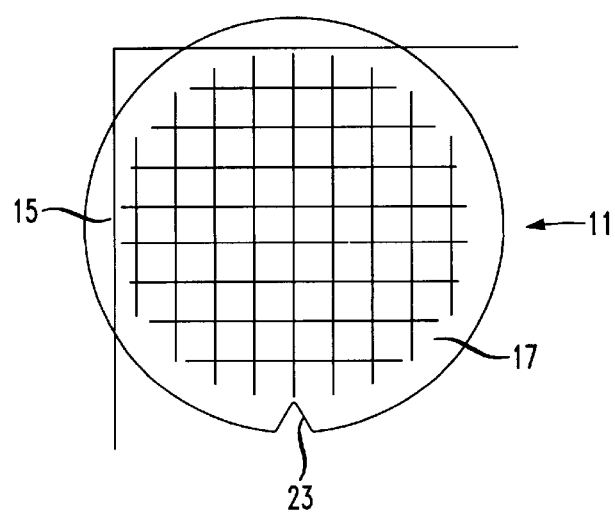
FIG. 2 is a top view of a semiconductor wafer
Figure 3:
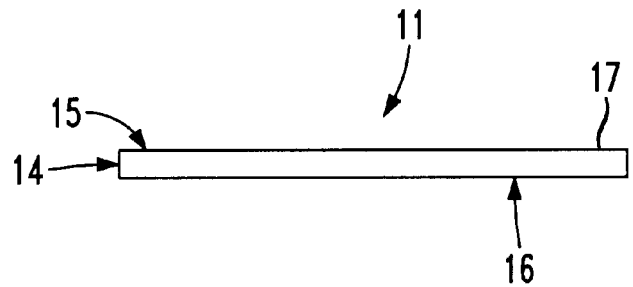
FIG. 3 is a side elevational view of a semiconductor wafer

With respect to FIGS. 2 and 3, a semiconductor wafer 11 is illustrated and includes a backside 16, and a front side or face 17. The terms front side and face are used herein to indicate the side of the wafer 11 upon which materials are deposited and electronic devices are formed. The term back or backside is used to indicate the reverse side of the wafer opposite the face. Normally, processing steps to create electronic devices or circuits are performed on the wafer backside. The electronic devices may be grouped into cells or chips 18 as illustrated in FIG. 2. The cells 18 are illustrated as being rectangular in shape and they are eventually separated from one another and attached to a substrate to form an integrated circuit. The wafer 11 also has a notch 23, or flat edge, which serves for alignment and orientation of the wafer 11 during the wafer processing steps.

The cells 18 are rectangular in shape, having linear edges as opposed to the curvilinear edge 14 of the wafer 11. Areas disposed along the edge 14 of the wafer 11 are not entirely rectangular in shape and are not functional for forming useable dies. Accordingly, an interval 15 is formed between the edge 14 of the wafer 11 and the edge of the useable or functional cells 18.

Figure 5:
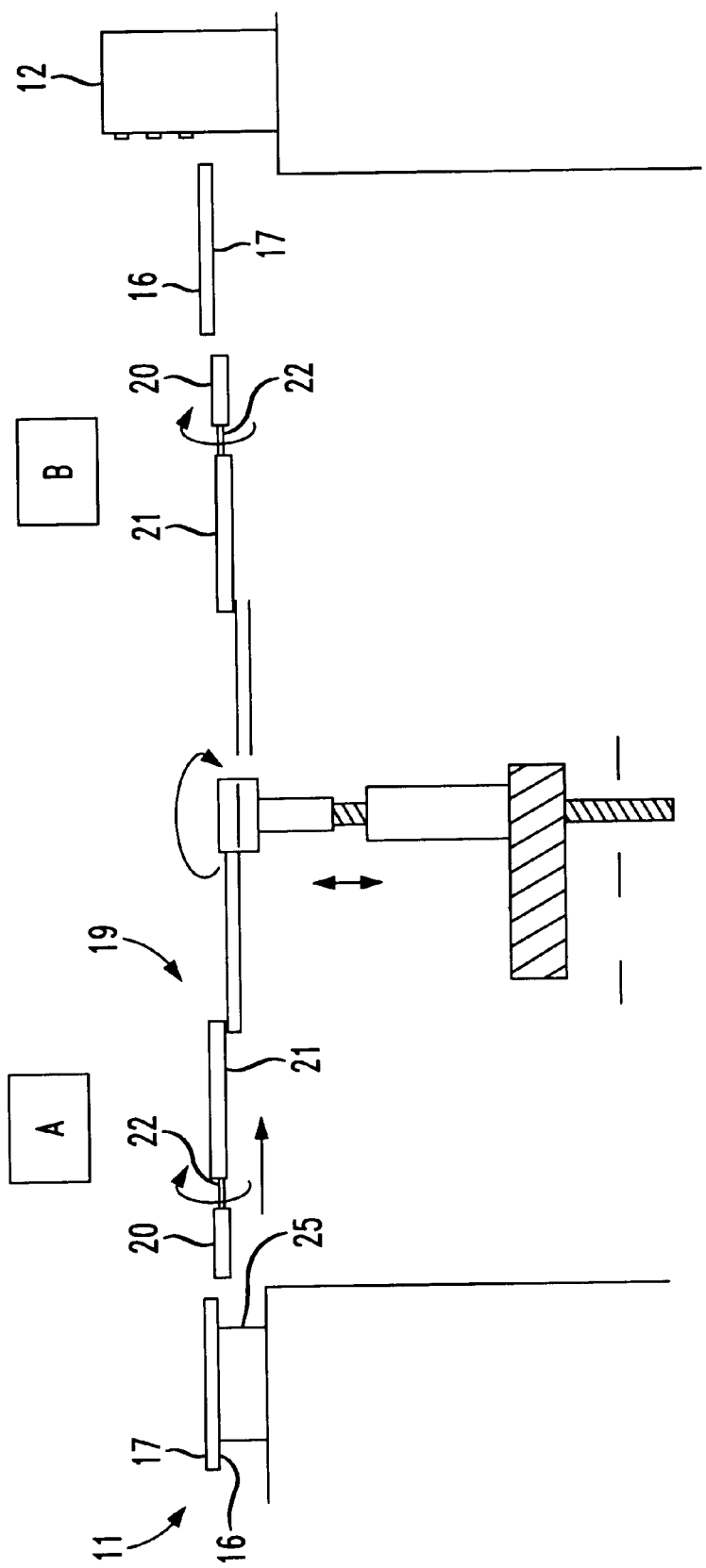
FIG. 5 is an illustration of a robotic wafer-handling device moving a semiconductor wafer between a storage cassette and a processing location.

During the course of the manufacturing process, the wafer 11 may be placed into a processing position with the backside 16 of the substrate in contact with the tool chuck 25, as illustrated in FIG. 5. The backside 16 of the wafer 11 may collect particulate contamination by its contact with the various tool chucks used during these processes.

Figure 4:
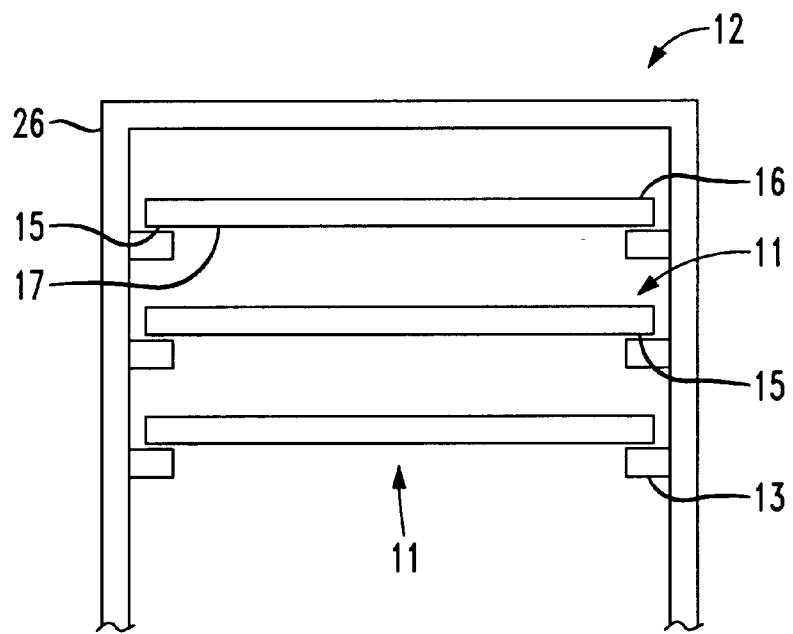
FIG. 4 is a partial front elevational view of a cassette with semiconductor wafers stored in a face down position.

As shown in FIGS. 3 and 4, the wafers 11 are stored in a storage device such as a cassette 12 between the different manufacturing steps. A cassette 12 generally includes an outer frame 26 within which a plurality of wafer edge supports 13 are vertically spaced. Edge supports 13 are commonly referred to as "shelves" in the art. Other structures of storages devices may be envisioned by those skilled in the art, including other structures that may support a wafer 11 from an edge interval 15 containing no active devices or from the curvilinear edge 14 of the wafer. In the past, the wafers 11 would be placed on the shelves in a face-up position with the backside 16 of the wafer 11 contacting the shelves 13. When the wafers 11 are stacked in the cassette 12, the wafers 11 may then be jarred releasing any debris or contaminants from the backside 16 which debris could then fall onto the face 17 of a lower stacked wafer 11.

In the present invention, as shown in FIG. 4, the wafers 11 are stacked in the cassette 12 in a face-down position. Prior to being inserted into the cassette 12, the wafer 11 is rotated upside down with the face 17 of the wafer 11 directed downward. Consequently, the backside 16 of the wafer 11 is directed upward and the force of gravity serves to secure any particulate matter present on the backside 16. The shelves 13 of the wafer 11 engage the face 17 of the wafer 11 along the interval 15. The interval ranges from approximately one millimeter to two centimeters wide along the perimeter of the wafer 11, and provides a sufficient area to support the wafer 11 on the shelf 13. In this manner, the particulate contaminant that may collect on the backside 16 of the wafer 11 will remain there when the wafer 11 is inserted in the cassette 12, and any particulate matter that does become loose will fall onto the backside of a lower stacked wafer rather than onto that wafer's face.

With respect to FIG. 5, a robotic wand 19 is shown loading and unloading a wafer 11 into a cassette 12. Position A represents the wafer 11 being removed by the wand 19 from a processing workstation tool chuck 25. Position B shows the wafer 11 having been rotated by the wand 19 to an upside down position for loading the wafer 11 in the cassette 12. The wand 19 includes a vacuum head 20 attached to an arm 21. The robotic wand 19 and head 20 are equipped with vacuum capabilities to secure the wafer 11 against the head 20. A means for rotating the wafer 11 such as rotary coupler or joint 22 allows the wand 19 to rotate or pivot 180 degrees about the axis of the arm 21. Conventional robotics parts and software can be used and programmed as known to those skilled in the art to position and orient the wafer 11 with respect to the cassette shelves 13 and the wafer tool chuck. One may appreciate that other means for rotating the wafer may be used to flip the wafer face side down and back, such as any sort of gear/shaft mechanism, edge grasping and turning mechanism, etc.

The wand 19 is preferably equipped with components such as a gimbal and/or force sensor, which are known in the art. Such components assure proper orientation of the wafer with the wand 19, detect when the wand 19 contacts the wafer 11, maintain sufficient vacuum between the wand 19 and wafer 11 and prevent unnecessary forces that can fracture the wafer 11. In addition, the wand 19 may be equipped with a scanning system that determines which slots of a cassette are populated with wafers, and the approximate location of the wafers with respect to wafer height, which scanning systems are also well known in the art.

Figure 6:
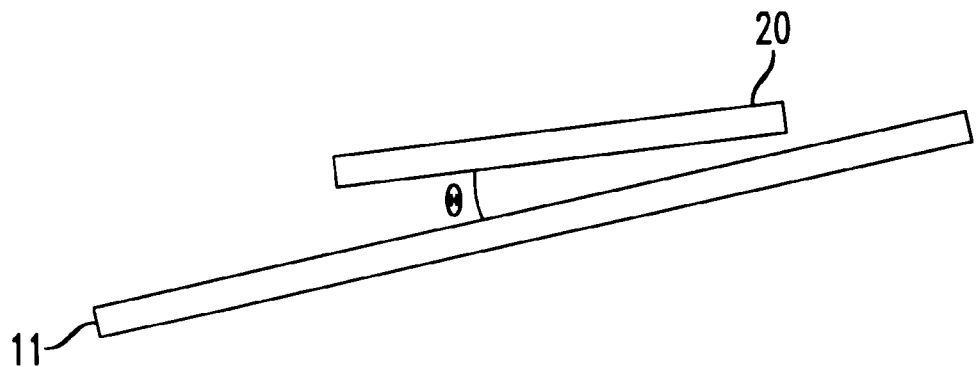
FIG. 6 is a front elevational view of a wafer skewed to a vacuum head.
Figure 7:
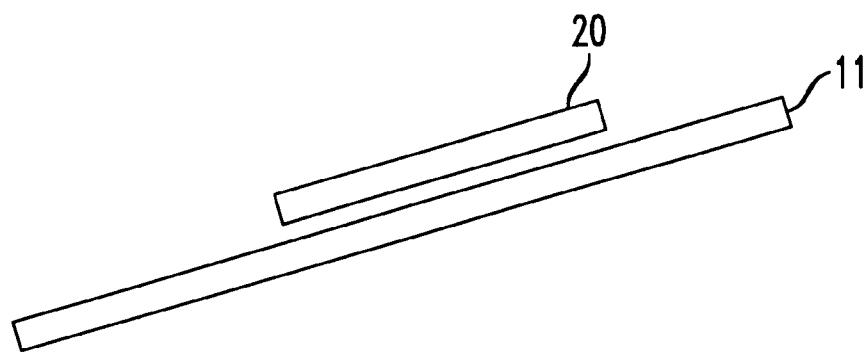
FIG. 7 is a front view with the vacuum head adjusted with respect to the wafer.

When a wafer 11 is positioned normally, the vacuum head 20 on the wafer secures the wafer 11 against the wand. In some cases, the wafer 11 may be slightly skewed at an angle theta with respect to a normal position of the vacuum head 20 as shown in FIG. 6. A gimble can be operated to rotate the head 20 and remove any such skew angles so the vacuum head approaches the wafer 11 in a normal position with respect to the wafer 11, as shown in FIG. 7.

In operation, the wand 19 engages and removes the wafer 11 from the chuck 25. The wand 19 rotates 180 degrees so the wafer is turned upside down with the backside 16 of the wafer 11 facing upward. The wand 19 then inserts the wafer 11 into the cassette 12 and onto a shelf 13. The interval 15 on the top surface of the wafer 11 engages the shelf 13 thereby avoiding contact between the shelf 13 and any functional die or chip 18.

When the wafer 11 must be placed on a processing station, the wand 19 engages the wafer 11 and removes the wafer 11 from the cassette 12. The wand 19 rotates 180 degrees so the face 17 of the wafer 11 faces upward and the backside 16 of the wafer 11 faces downward. Thus, the wafer can be placed in a processing station in a face upward orientation for further processing.

Although the invention is illustrated as being implemented by automated equipment, one skilled in the art may appreciate that manual handling and storage of a semiconductor wafer may be accomplished in a similar manner. In any storage location for wafer 11 where it may be exposed to falling particulate matter, the wafer 11 may be stored in a face-down position to protect its face 17. Similarly, in any location where a wafer 11 may be handled above another wafer, the wafer 11 may be rotated to a face-down position in order to secure any particulate matter on its back side 16.

Figure 8:
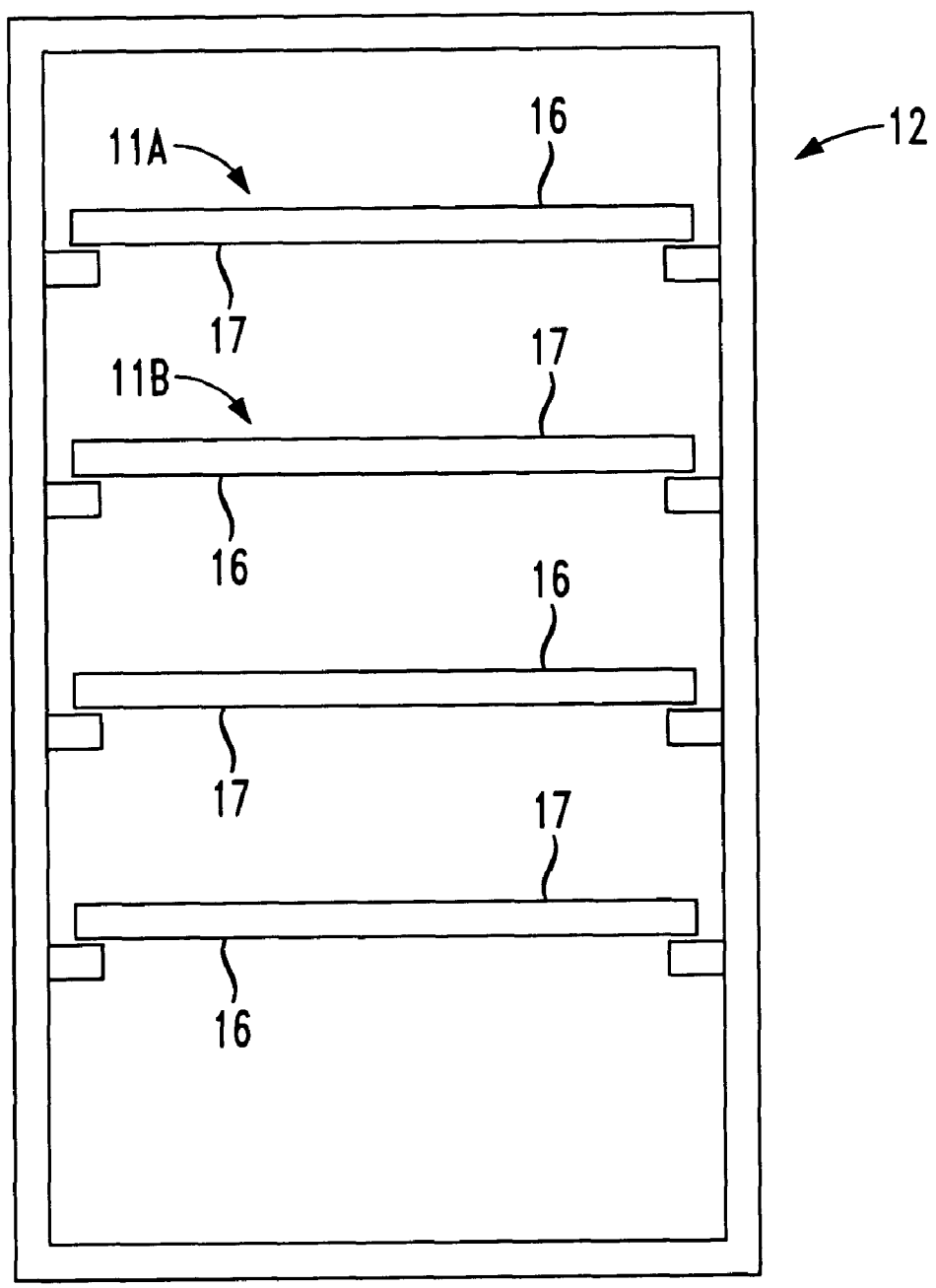
FIG. 8 is a front elevational view of semiconductor wafers stored in alternating positions.

An additional embodiment of the invention alternates the position of the wafers 11. As shown in FIG. 8, a first wafer 11A is in an upside down position, with the face 16 of the wafer facing downward. The next wafer 11B is positioned with the face 16 of the wafer facing upward. The wafers are alternated as such within the cassette.

In yet another embodiment, the wafers are vertically disposed within a cassette. The cassette includes shelves that are horizontally spaced apart, and support the wafers in a vertical position, so that particulate falling from the backside of a wafer 11 will not touch or collect on other wafers in the cassette. In this embodiment, the wafers may be disposed at angles with respect to the cassette. In the previous embodiment, where the wafers are horizontally disposed there is little if any difference in skew angle between the wafers. The only variable is the skew angle between the wafer 11 and the vacuum head 20.

The vertical disposition of wafers imposes two variable angles including the angle between the wafer and the cassette, and the angle between respective wafers. Thus a device is necessary to bias the wafers to remove the variable angle between the wafers, so the wand 19 and head 20 may be rotated as necessary to engage a wafer 11. In this embodiment, it may also be desirable to orient wafers in a back-to-back and face-to-face arrangement.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What we claim as our invention is:

1. A method for minimizing semiconductor wafer contamination, the method comprising the step of positioning a plurality of semiconductor wafers in a wafer storage device in a face down position with a backside of the wafers facing upward and a face of each of the wafers facing downward, and said wafers are located at a semiconductor processing station and said positioning step includes the steps of removing the wafers from the processing station, rotating the wafers so the backside of the wafers face upward and inserting the wafers into the storage device, and thereby preventing contaminants from falling from the backside of a wafer and landing on a face of the wafers positioned therebelow, further including the step of positioning a plurality of semiconductor wafers in alternating rotated and non-rotated positions with respect to one another.

* * * * *